US008866492B2

(12) United States Patent  
Hori et al.

(10) Patent No.: US 8,866,492 B2  
(45) Date of Patent: Oct. 21, 2014

(54) MANUFACTURING METHOD, SWITCHING APPARATUS, TRANSMISSION LINE SWITCHING APPARATUS, AND TEST APPARATUS

(75) Inventors: Hisao Hori, Miyagi (JP); Yoshikazu Abe, Miyagi (JP); Yoshihiro Sato, Miyagi (JP)

(73) Assignee: Advantest Corporation, Tokyo (JP)

( * ) Notice: Subject to any disclaimer, the term of this patent is extended or adjusted under 35 U.S.C. 154(b) by 323 days.

(21) Appl. No.: 13/277,235

(22) Filed: Oct. 20, 2011

(65) Prior Publication Data

US 2012/0286801 A1 Nov. 15, 2012

(30) Foreign Application Priority Data

May 13, 2011 (JP) ................................. 2011-108552

(51) Int. Cl.
*G01R 27/28* (2006.01)
*H01L 41/318* (2013.01)
*H01L 41/335* (2013.01)
*H01H 57/00* (2006.01)
*G01R 31/28* (2006.01)
*H01L 41/08* (2006.01)
*H01L 41/187* (2006.01)
*H01L 41/319* (2013.01)
*H01L 41/29* (2013.01)

(52) U.S. Cl.
CPC ........... *H01L 41/318* (2013.01); *H01L 41/0805* (2013.01); *H01L 41/335* (2013.01); *H01L 41/1876* (2013.01); *H01L 2057/006* (2013.01); *H01L 41/319* (2013.01); *H01H 57/00* (2013.01); *G01R 31/2889* (2013.01); *H01L 41/29* (2013.01)

USPC .......... 324/612; 324/72; 324/76.11; 324/415; 324/418; 324/422; 324/727

(58) Field of Classification Search
USPC ........ 324/72, 76.11, 415, 418, 422, 612, 727; 73/649; 310/200; 200/61.41
See application file for complete search history.

(56) References Cited

U.S. PATENT DOCUMENTS 4,634,917 A * 1/1987 Dvorsky et al. ............... 310/328  
5,436,987 A * 7/1995 Saito et al. ...................... 385/16

(Continued)

FOREIGN PATENT DOCUMENTS

JP H11-145134 A 5/1999  
JP H11-346012 A 12/1999

(Continued)

OTHER PUBLICATIONS

"Notification of Reasons for Refusal" issued by the Japanese Patent Office for application No. 2011-108552.

*Primary Examiner* — Patrick Assouad  
*Assistant Examiner* — Sean Curtis

(57) ABSTRACT

An actuator is manufactured that includes piezoelectric film that does not suffer physical damage. Provided is a manufacturing method comprising first insulating layer deposition of depositing a first insulating layer on a substrate using an insulating material; first annealing of annealing the first insulating layer; first electrode layer deposition of depositing a first electrode layer on the first insulating layer using a conductive material; first piezoelectric film deposition of depositing a first piezoelectric film on the first electrode layer by applying a sol-gel material on the first electrode layer and annealing the sol-gel material; second electrode layer deposition of depositing a second electrode layer on the first piezoelectric film using a conductive material; second insulating layer deposition of depositing a second insulating layer on the second electrode layer using an insulating material; and second annealing of annealing the second insulating layer.

15 Claims, 13 Drawing Sheets

(56) References Cited

U.S. PATENT DOCUMENTS

| | | | |
|---|---|---|---|
| 5,648,300 A * | 7/1997 | Nakayama et al. | 438/611 |
| 7,402,907 B2 * | 7/2008 | Ohguro | 257/734 |
| 7,649,430 B2 * | 1/2010 | Takeuchi et al. | 333/104 |
| 8,372,469 B2 * | 2/2013 | Eriksson et al. | 427/2.24 |
| 8,456,727 B2 * | 6/2013 | Yasuda | 359/224.1 |
| 2006/0208612 A1 * | 9/2006 | Takayama et al. | 310/311 |
| 2008/0142348 A1 * | 6/2008 | Nguyen et al. | 200/275 |
| 2009/0085690 A1 * | 4/2009 | Takeuchi et al. | 333/103 |
| 2009/0115821 A1 * | 5/2009 | Tsukamoto | 347/68 |
| 2011/0204995 A1 * | 8/2011 | Jamneala et al. | 333/187 |

FOREIGN PATENT DOCUMENTS

| | | | |
|---|---|---|---|
| JP | 2008-47689 A | | 2/2008 |
| JP | 2008047689 A | * | 2/2008 |
| JP | 2009-286120 A | | 12/2009 |

* cited by examiner

MANUFACTURING METHOD, SWITCHING APPARATUS, TRANSMISSION LINE SWITCHING APPARATUS, AND TEST APPARATUS

BACKGROUND

1. Technical Field

The present invention relates to a manufacturing method, a switching apparatus, a transmission line switching apparatus and a test apparatus.

2. Related Art

An actuator including piezoelectric film is conventionally formed by layering piezoelectric films and electrode layers on a support substrate made of metal or ceramic, and heating the entire support substrate on which the plurality of layers are formed to a firing temperature of the piezoelectric film, as shown in Patent Document 1, for example.

Patent Document 1: Japanese Patent Application Publication No. H11-346012

However, the firing temperature for firing the piezoelectric films is a high temperature of 700° C. or more, and so when forming such an actuator, different thermal stress occurs in each of the layers, resulting in physical damage such as cracking, chipping, and fracturing of the actuator. Even if the thickness of the support substrate is adjusted when forming the actuator, it is difficult to achieve both elasticity for deforming in response to expansion and contraction of the piezoelectric film and rigidity for returning to the original state after deformation. For example, when the actuator is provided with contact points and used as a switch that causes a contact point to contact or move away from a fixed contact point according to expansion and contraction of the piezoelectric film, the contact points can become stuck together and unable to move away from each other.

SUMMARY

Therefore, it is an object of an aspect of the innovations herein to provide a manufacturing method, a switching apparatus, a transmission line switching apparatus, and a test apparatus, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, provided is a manufacturing method comprising first insulating layer deposition of depositing a first insulating layer on a substrate using an insulating material; first annealing of annealing the first insulating layer; first electrode layer deposition of depositing a first electrode layer on the first insulating layer using a conductive material; first piezoelectric film deposition of depositing a first piezoelectric film on the first electrode layer by applying a sol-gel material on the first electrode layer and annealing the sol-gel material; second electrode layer deposition of depositing a second electrode layer on the first piezoelectric film using a conductive material; second insulating layer deposition of depositing a second insulating layer on the second electrode layer using an insulating material; and second annealing of annealing the second insulating layer.

The summary clause does not necessarily describe all necessary features of the embodiments of the present invention. The present invention may also be a sub-combination of the features described above.

DESCRIPTION OF EXEMPLARY EMBODIMENTS

Figure 1:
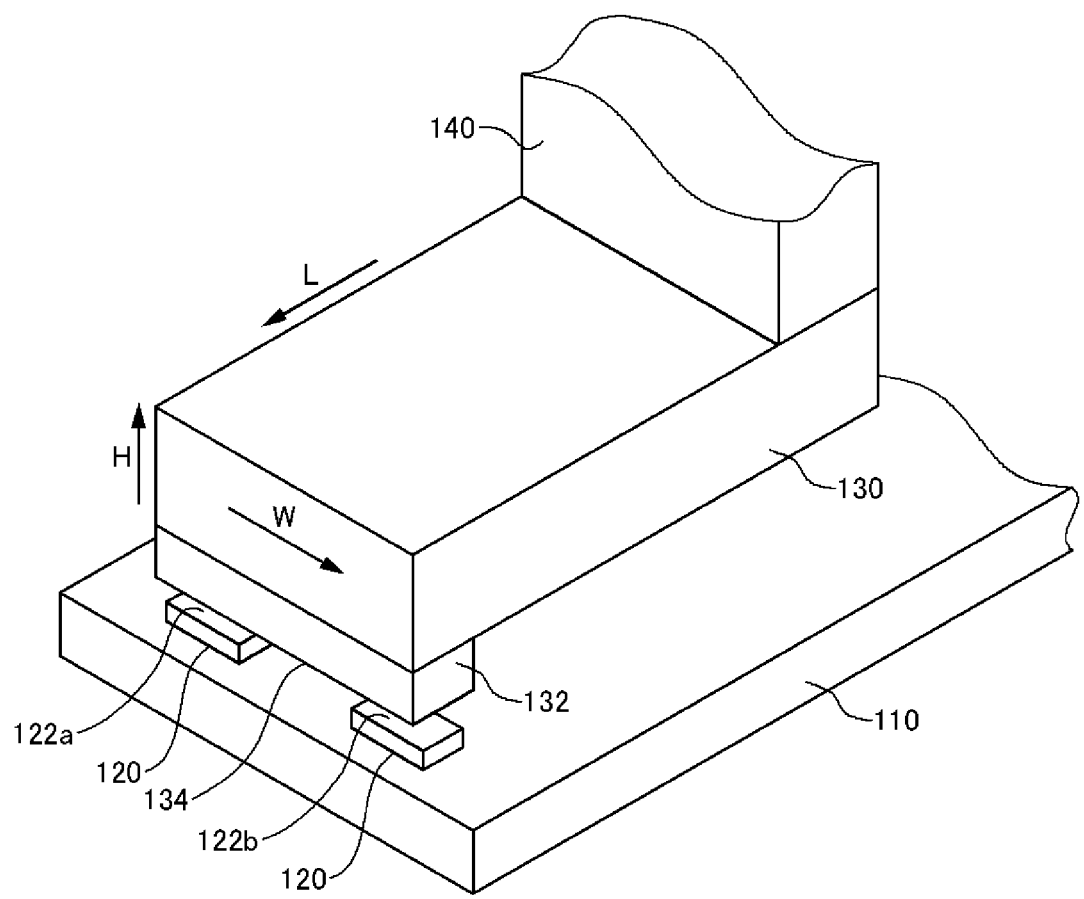
FIG. 1 shows an exemplary configuration of a switching apparatus 100 according to an embodiment of the present invention.

Hereinafter, some embodiments of the present invention will be described. The embodiments do not limit the invention according to the claims, and all the combinations of the features described in the embodiments are not necessarily essential to means provided by aspects of the invention. The following describes various embodiments while referencing drawings, and components that are the same or similar in multiple drawing are given the same reference numerals and redundant descriptions are omitted. The drawings are schematic representations, and do not represent the actual scale of the objects shown. For ease of explanation, components may be shown using different scales in different drawings.

Figure 2:
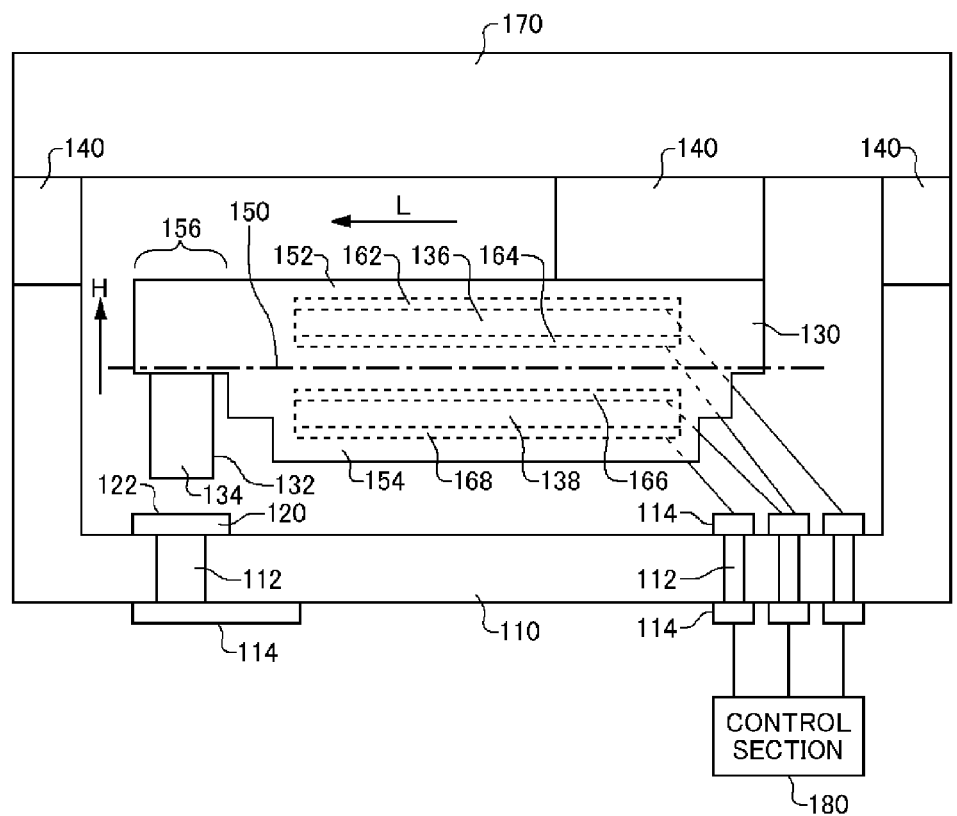
FIG. 2 shows a side view of the switching apparatus 100 according to the present embodiment.

FIG. 1 shows an exemplary configuration of a switching apparatus 100 according to an embodiment of the present invention. FIG. 2 shows a side view of the switching apparatus 100 according to the present embodiment. The switching apparatus 100 includes an actuator 130 in which piezoelectric films and electrodes applying voltage to the piezoelectric films are covered by an insulating film. The switching apparatus 100 increases the rigidity of the actuator 130 and prevents physical damage to the actuator 130, such as cracking, chipping, or fracturing.

The switching apparatus 100 causes a first contact point 122 and a second contact point 134 to be in an electrically conductive state or non-conductive state by causing the first contact point 122 and the second contact point 134 to be in contact with each other or move away from each other. The switching apparatus 100 may be housed and sealed in a package, for example. The switching apparatus 100 includes a lower substrate section 110, a first contact point section 120, the actuator 130, a base portion 140, an upper substrate section 170, and a control section 180.

The lower substrate section 110 includes a flat first surface on which the first contact point section 120 is disposed. The lower substrate section 110 may be an insulator such as a glass substrate, or may be a semiconductor substrate made of silicon, for example. The lower substrate section 110 includes vias 112 and wiring sections 114. The lower substrate section 110 may include the wiring sections 114 on a second surface thereof, which is different from the first surface on which the first contact point section 120 is provided.

A via 112 penetrates through the first surface and the second surface of the lower substrate section 110, and is coated with metal to provide an electrical connection between the first contact point section 120 and the wiring section 114. Furthermore, vias 112 may be formed of metal providing an electrical connection between wiring sections 114 on the first surface of the lower substrate section 110 and wiring sections 114 on the second surface. The vias 112 may be filled with a conductive material to keep through-holes formed between the top surface and the bottom surface of the lower substrate section 110 in a sealed state. A plurality of vias 112 may be provided to the lower substrate section 110, such that the number of vias 112 corresponds to the number of electrical signals supplied to the actuator 130 and the number of first contact point sections 120 in the lower substrate section 110.

The wiring sections 114 transmit a signal passed through the switching apparatus 100 or an electrical signal supplied to the actuator 130. The wiring sections 114 may be a wiring pattern provided on the first surface or second surface of the lower substrate section 110 to receive or transmit a signal to or from at least one via 112. The wiring sections 114 may include a land, a connector, and/or an antenna, and may transmit and receive signals passed through the switching apparatus 100 from the outside.

The first contact point section 120 includes a first contact point 122. A plurality of first contact point sections 120 may be provided. The first contact point 122 may be a flat surface without any protrusions. The first contact point section 120 may include aluminum, tungsten, palladium, rhodium, gold, platinum, ruthenium, indium, iridium, osmium, molybdenum, and/or nickel. The first contact point 122 may be an alloy of two or more of the above materials.

The actuator 130 includes a second contact point 134, and moves the second contact point 134 to contact the first contact point 122 or move away from the first contact point 122. The actuator 130 may be deposited by a semiconductor manufacturing apparatus using CVD (Chemical Vapor Deposition). The actuator 130 includes a second contact point section 132, a first piezoelectric film 136, a second piezoelectric film 138, a first insulating layer 152, a second insulating layer 150, a third insulating layer 154, a protruding section 156, a first electrode layer 162, a second electrode layer 164, a third electrode layer 166, and a fourth electrode layer 168.

A second contact point 134 is provided on the second contact point section 132. The second contact point section 132 may include the same metal as the first contact point section 120. The second contact point 134 may be a flat pad without protrusions, so as to contact the surface of the first contact point 122. Instead, the second contact point 134 may have a protrusion.

The second contact point 134 may be semispherical in order to prevent degradation or damage of the first contact point 122, or may have a tip shaped as a rounded needle. For example, the second contact point 134 may have a predetermined shape that, when the second contact point 134 contacts the first contact point 122 to form a transmission path, creates a signal path having a width corresponding to the frequency of the signal being transmitted.

In the present embodiment, the switching apparatus 100 includes two first contact point sections 120 on the lower substrate section 110, and two first contact points 122 of the first contact point sections 120 are brought into contact with and moved away from one second contact point 134. In this way, the switching apparatus 100 can switch between an electrically conductive state and an electrically non-conductive state between the first contact point 122a and the first contact point 122b via the second contact point 134. The wiring section 114 transmits a signal from the outside to the first contact point 122a, and this signal is transmitted from the first contact point 122b to the outside when the switching apparatus 100 is ON.

Instead, the switching apparatus 100 may include one first contact point section 120 on the lower substrate section 110, and wiring that transmits a signal from the outside to the second contact point 134 may be provided on the actuator 130. This wiring may transmit the electrical signal from the outside to the first contact point section 120, receive the electrical signal via the second contact point 134, and transmit the electrical signal to the outside. The switching apparatus 100 can switch the signal transmission from the second contact point 134 to the first contact point 122 ON/OFF, and may transmit a signal, received from the outside, to the outside from the second contact point 134 via the first contact point 122 when the switching apparatus 100 is ON.

The first piezoelectric film 136 is formed on the second insulating layer 150, and expands and contracts according to a first drive voltage. When the first drive voltage is applied, the first piezoelectric film 136 expands or contracts in the longitudinal direction of the actuator 130, thereby causing the actuator 130 to bend in a direction that changes the distance between the first contact point 122 and the second contact point 134.

The first piezoelectric film 136 may be formed of Perovskite ferroelectric substances such as barium titanate (BTO), lead lanthanum zirconate titanate (PLZT), Lead zirconate titanate (PZT), aluminum nitride (AlN), or a zinc oxide (ZnO) wurtzite crystal. For example, the first piezoelectric film 136 may be made of PZT and have a width in the W direction of 90 μm, a length in the L direction of 750 μm, and a height in the H direction of 0.5 μm.

The second piezoelectric film 138 is provided on a different surface of the second insulating layer 150 than the surface on which the second piezoelectric film 138 is formed, faces the first piezoelectric film 136 via the second insulating layer 150, and expands and contracts according to a second drive voltage. The second piezoelectric film 138 may be formed using perovskite ferroelectric substances, in the same manner as the first piezoelectric film 136. When the second drive voltage is applied, the second piezoelectric film 138 expands or contracts in the longitudinal direction of the actuator 130, thereby causing the actuator 130 to bend in a direction that changes the distance between the first contact point 122 and the second contact point 134.

The second piezoelectric film 138 preferably uses substantially the same material and has substantially the same shape as the first piezoelectric film 136. For example, the second piezoelectric film 138 may be made of PZT and have a width in the W direction of 90 μm, a length in the L direction of 750 μm, and a height in the H direction of 0.5 μm.

The actuator 130 moves the second contact point 134 to contact or move away from the first contact point 122, according to the expansion and contraction of the first piezoelectric film 136 and the second piezoelectric film 138. The first piezoelectric film 136 and the second piezoelectric film 138 may be arranged on respective sides, in the height direction, of the center plane of the actuator 130. The first piezoelectric film 136 and the second piezoelectric film 138 may be at substantially the same distance in the height direction from the central plane of the actuator 130, and may have substantially the same height. The actuator 130 may include a plurality of films that are layered substantially symmetrically with respect to the central plane of the actuator 130 in the height direction. In FIG. 2, the dashed line indicates the central plane in the height direction of the actuator 130.

The second insulating layer 150 is provided between the first piezoelectric film 136 and the second piezoelectric film 138. The second insulating layer 150 may be formed as a support layer of the actuator 130. The second insulating layer 150 is elastic and deforms when force is applied thereto, so that the actuator 130 bends when the first piezoelectric film 136 and/or the second piezoelectric film 138 expands or contracts to exert a force on the second insulating layer 150. The second insulating layer 150 is rigid enough to prevent the actuator 130 from being bent too much, and to return the actuator 130 to the initial position when the first piezoelectric film 136 and the second piezoelectric film 138 are not applying a force.

When forming the first piezoelectric film 136 and/or the second piezoelectric film 138, the second insulating layer 150 is heated to a firing temperature along with the first piezoelectric film 136 and/or the second piezoelectric film 138. Therefore, the second insulating layer 150 is made from a material that is not damaged when heated to the firing temperature of the first piezoelectric film 136 and/or the second piezoelectric film 138. If the first piezoelectric film 136 and the second piezoelectric film 138 are made of PZT, for example, the firing temperature can exceed 700° C. Accordingly, the second insulating layer 150 is preferably made of a material that does not exhibit physical damage such as cracks or fractures when heated to the firing temperature of the first piezoelectric film 136 and/or the second piezoelectric film 138.

Furthermore, the second insulating layer 150 is preferably made of a material that is unlikely to cause a chemical reaction with the piezoelectric films or the electrode layers when heated to the firing temperature of the first piezoelectric film 136 and the second piezoelectric film 138. The first second insulating layer 150 is preferably made of a material that forms a compound with the piezoelectric films or the electrode layers as a result of being heated to the firing temperature of the piezoelectric films, and that does not exhibit physical damage such as cracks or fractures. In this case, the second insulating layer 150 is preferably made of a material that does not degrade the film characteristics, such as the piezoelectric constant, of the first piezoelectric film 136 or the second piezoelectric film 138 when heated to the firing temperature of the piezoelectric films.

The second insulating layer 150 can be formed in a short time using a method such as CVD that is less expensive than a metal film. The second insulating layer 150 may include silicon oxide ($SiO_2$) or silicon nitride (SiN). The second insulating layer 150 may be silicon oxide ($SiO_2$), for example. Instead, the second insulating layer 150 may be silicon nitride (SiN), for example. The second insulating layer 150 may be made of silicon oxide ($SiO_2$) and have a width in the W direction of 90 μm, a length in the L direction of 750 μm, and a height in the H direction of 4 μm.

The protruding section 156 is a tip portion of the second insulating layer 150, which is the moving portion of the actuator 130, on which the first piezoelectric film 136 and second piezoelectric film 138 are not provided. The second contact point section 132 may be provided on the protruding section 156. In this way, the second contact point 134 can be formed at a position distanced from the first electrode layer 162, the second electrode layer 164, the third electrode layer 166, and the fourth electrode layer 168, and can decreases the effect of the electrical signal supplied to each of the electrode layers.

The first electrode layer 162 and the second electrode layer 164 are respectively formed on the top and bottom surfaces of the first piezoelectric film 136, and apply the first drive voltage to the first piezoelectric film 136. The first drive voltage may be a prescribed voltage that is positive or negative. The first electrode layer 162 and the second electrode layer 164 may each be flat and extend in the length direction L of the actuator 130. The first electrode layer 162 and the second electrode layer 164 may be made from metals that can be easily machined with low resistance, such as aluminum, gold, platinum, copper, indium, tungsten, molybdenum, ruthenium, and iridium, oxide compound electrodes such as ruthenium oxide ($RuO_2$) and iridium oxide ($IrO_2$), ceramic electrodes, or semiconductors such as silicon.

If silicon is used as the electrode material, the silicon is preferably doped to have high impurity density. For example, the first electrode layer 162 and the second electrode layer 164 of the present embodiment may each be made of platinum and have a height of 0.2 μm in the height direction H. If the platinum is deposited using a vacuum deposition technique such as sputtering, the platinum may be deposited after depositing titanium, tantalum, or chrome, for example.

The third electrode layer 166 and the fourth electrode layer 168 are respectively formed on the top and bottom surfaces of the second piezoelectric film 138, and apply the second drive voltage to the second piezoelectric film. The third electrode layer 166 and the fourth electrode layer 168 may each be flat and extend in the length direction L of the actuator 130. The third electrode layer 166 and the fourth electrode layer 168 may be made of the substantially same material as and have substantially the same shape as the first electrode layer 162 and the second electrode layer 164. As another example, the third electrode layer 166 may be made of the substantially same material as and have substantially the same shape as the second electrode layer 164, and the fourth electrode layer 168 may be made of the substantially same material as and have substantially the same shape as the first electrode layer 162.

The first insulating layer 152 is formed of an insulating material on the first piezoelectric film 136, and contacts the second insulating layer 150 at least at the end portion of the first piezoelectric film 136, to cover this end portion. The first insulating layer 152 and the second insulating layer 150 may be formed to cover the first piezoelectric film 136, the first electrode layer 162, and the second electrode layer 164 such that none of these layers are exposed. For example, the first insulating layer 152 and the second insulating layer 150 may completely cover each layer. The first insulating layer 152 and the second insulating layer 150 may be formed to expose a connecting portion that connects the wiring sections 114 to the first electrode layer 162 and the second electrode layer 164.

The first insulating layer 152 and the second insulating layer 150 may be formed to cover a portion of the first piezoelectric film 136, the first electrode layer 162, and the second electrode layer 164. For example, the first insulating layer 152 and the second insulating layer 150 may cover a side portion of each layer. In other words, the first insulating layer 152 and the second insulating layer 150 may cover a side portion of the actuator 130. The first insulating layer 152 and the second insulating layer 150 may cover the second insulating layer 150 side of the actuator 130.

The third insulating layer 154 is formed of an insulating material on the second piezoelectric film 138, and contacts the second insulating layer 150 at least at the end portion of the second piezoelectric film 138, to cover this end portion. The third insulating layer 154 and the second insulating layer 150 may be formed to cover the second piezoelectric film 138, the fourth electrode layer 168, and the third electrode layer 166 such that none of these layers are exposed. For example, the third insulating layer 154 and the second insulating layer 150 may completely cover each layer. The third insulating layer 154 and the second insulating layer 150 may be formed to expose a connecting portion that connects the wiring sections 114 to the first electrode layer 162, the second electrode layer 164, the fourth electrode layer 168, and the third electrode layer 166.

The third insulating layer 154 and the second insulating layer 150 may be formed to cover a portion of the second piezoelectric film 138, the fourth electrode layer 168, and the third electrode layer 166. For example, the third insulating layer 154 and the second insulating layer 150 may cover a side portion of each layer. In other words, the third insulating layer 154 and the second insulating layer 150 may cover a side portion of the actuator 130. The third insulating layer 154 and the second insulating layer 150 may cover the second insulating layer 150 side of the actuator 130.

The first insulating layer 152 and the third insulating layer 154 may be formed of silicon oxide or silicon nitride (SiN). The first insulating layer 152 and the third insulating layer 154 may be formed of a similar type of insulating material as the second insulating layer 150, and are preferably formed of substantially the same insulating material as the second insulating layer 150. In other words, the first insulating layer 152 and the third insulating layer 154 are formed to be both elastic and rigid, to effectively seal the second insulating layer 150, and to have a strong connection, in the same manner as the second insulating layer 150.

In this way, the first insulating layer 152, the third insulating layer 154, and the second insulating layer 150 having substantially the same elasticity and rigidity cover the first piezoelectric film 136, the second piezoelectric film 138, the first electrode layer 162, the second electrode layer 164, the third electrode layer 166, and the fourth electrode layer 168. Therefore, when the actuator 130 is manufactured or when the actuator 130 is bent, physical damage such as cracking, chipping, and fracturing is prevented in each layer. Furthermore, since the first insulating layer 152 and the third insulating layer 154 are rigid, the rigidity of the actuator 130 is increased.

The first insulating layer 152 and the third insulating layer 154 are made of substantially the same material as the second insulating layer 150, and therefore have substantially the same rigidity and elasticity as the second insulating layer 150. Accordingly, when the actuator 130 is moved, the first insulating layer 152 and the third insulating layer 154 can restrict the stress caused by a mismatch of rigidity and elasticity within the actuator 130. Furthermore, the first insulating layer 152 and the third insulating layer 154 cause the residual stress, thermal stress, or the like due to the layering of a plurality of films that causes the actuator 130 to move in a direction resulting in bowing and the residual stress, thermal stress, or the like that causes the actuator 130 to move in a direction opposite the bowing to be substantially the same and cancel each other out, thereby restricting bowing of the actuator 130.

As a result, the actuator 130 can prevent the contact points from sticking together. Furthermore, since the first insulating layer 152, the third insulating layer 154, and the second insulating layer 150 prevent the second piezoelectric film 138, the first electrode layer 162, the second electrode layer 164, the third electrode layer 166, and the fourth electrode layer 168 from being exposed to the outside, oxidation of these layers is prevented, for example.

The base portion 140 is made of a conductive material and fixes the fixed end of the actuator 130 to the upper substrate section 170. The base portion 140 is formed by etching the conductive material. The base portion 140 may be formed from a silicon substrate, for example. The actuator 130 may be fixed to the upper substrate section 170 via the base portion 140, for example.

The present embodiment describes an example in which the base portion 140 fixes the actuator 130 to the upper substrate section 170, but instead, the base portion 140 may be formed on the lower substrate section 110 at a position near the first contact point section 120 but distanced therefrom. In this case, the height of the base portion 140 may be less than or equal to the maximum displacement of the actuator 130. The maximum displacement of the actuator 130 refers to the displacement of the actuator 130 when the maximum drive voltage is applied to the first piezoelectric film 136 and/or the second piezoelectric film 138.

One end of the actuator 130 in the length direction L may be supported by the base portion 140. When the first drive voltage is applied to the first piezoelectric film 136 or the second piezoelectric film 138, the end of the actuator 130 on the second contact point section 132 side that is not supported by the base portion 140 bends in the height direction, which results in downward displacement or upward displacement in FIG. 2.

The control section 180 applies the first drive voltage to the first piezoelectric film 136 and the second drive voltage to the second piezoelectric film 138. When bringing the first contact point 122 and the second contact point 134 into contact with each other to turn ON the switching apparatus 100, the control section 180 causes the second piezoelectric film 138 to contract by applying the second drive voltage to the second piezoelectric film 138. When moving the first contact point 122 and the second contact point 134 away from each other to turn OFF the switching apparatus 100, the control section 180 stops the supply of the second drive voltage to the second piezoelectric film 138.

Here, the first piezoelectric film 136 and the second piezoelectric film 138 of the present embodiment have substantially the same height and are at substantially the same distance from the central plane in the height direction of the actuator 130, and therefore the stress generated by the first piezoelectric film 136 causing bowing and the stress generated by the second piezoelectric film 138 restricting bowing are substantially the same. Furthermore, the actuator 130 includes a plurality of films that are layered substantially symmetrically with respect to the central plane in the height direction, and therefore the residual stress, thermal stress, or the like due to the layering of a plurality of films that causes the actuator 130 to move in a direction resulting in bowing and the residual stress, thermal stress, or the like that causes the actuator 130 to move in a direction opposite the bowing to be substantially the same and cancel each other out, thereby restricting bowing of the actuator 130. In this way, the actuator 130 can restrict bowing due to thermal stress, and can therefore perform switching in a variety of temperature environments.

When bringing the first contact point 122 and the second contact point 134 into contact with each other to turn ON the switching apparatus 100, the control section 180 may cause the second piezoelectric film to contract by applying the second drive voltage to the second piezoelectric film 138. When moving the first contact point 122 and the second contact point 134 away from each other to turn OFF the switching apparatus 100, the control section 180 may stop the supply of the second drive voltage to the second piezoelectric film 138.

Furthermore, when bringing the first contact point 122 and the second contact point 134 into contact with each other to turn ON the switching apparatus 100, the control section 180 may cause the first piezoelectric film 136 to expand by applying the first drive voltage to the first piezoelectric film 136. When moving the first contact point 122 and the second contact point 134 away from each other to turn OFF the switching apparatus 100, the control section 180 may stop the supply of the first drive voltage to the first piezoelectric film 136.

When bringing the first contact point 122 and the second contact point 134 into contact with each other to turn ON the switching apparatus 100, the control section 180 may cause the first piezoelectric film 136 to expand by applying the first drive voltage to the first piezoelectric film 136 and cause the second piezoelectric film 138 to contract by applying the second drive voltage to the second piezoelectric film 138. When moving the first contact point 122 and the second contact point 134 away from each other to turn OFF the switching apparatus 100, the control section 180 may stop the supply of the drive voltages to the first piezoelectric film 136 and the second piezoelectric film 138.

When moving the first contact point 122 and the second contact point 134 away from each other to turn OFF the switching apparatus 100, the control section 180 may bias the actuator 130 in a return direction by applying a voltage to the first piezoelectric film 136 having a different polarity than the first drive voltage. Similarly, when turning OFF the switching apparatus 100, the control section 180 may bias the actuator 130 in the return direction by applying a voltage to the second piezoelectric film 138 having a different polarity than the second drive voltage.

The control section 180 may supply the first piezoelectric film 136 and the second piezoelectric film 138 with predetermined values as the first drive voltage and the second drive voltage. The control section 180 may be hardware such as an electronic circuit, or may be software that operates according to a program, for example.

The present embodiment describes an example in which the second contact point section 132 is provided on the protruding section 156, but instead, the second contact point section 132 may be provided on the moving end of the third insulating layer 154. In this case, the actuator 130 need not include the protruding section 156.

Figure 3:
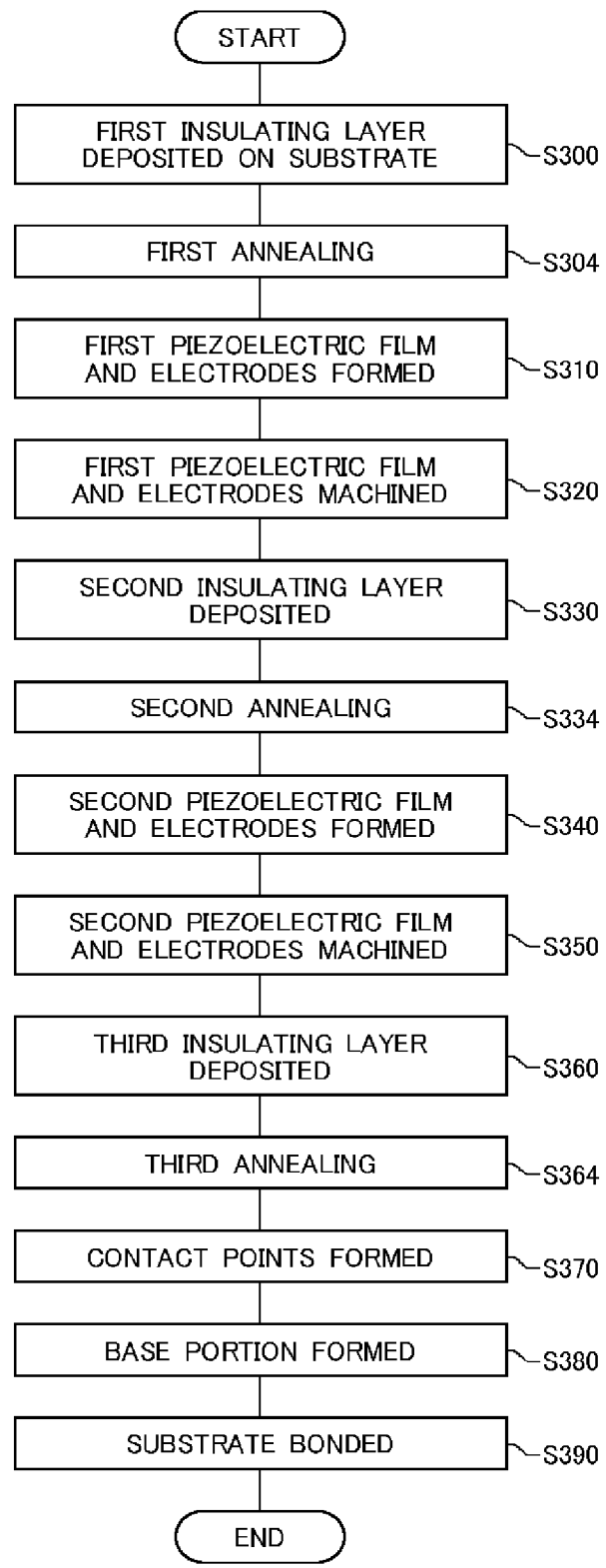
FIG. 3 shows an exemplary manufacturing method for forming the switching apparatus 100 according to the present embodiment.

FIG. 3 shows an exemplary manufacturing method for forming the switching apparatus 100 according to the present embodiment. FIGS. 4 to 16 show cross sections of the switching apparatus 100 at each stage in the process for forming the switching apparatus 100 according to the present embodiment.

First, the first insulating layer 152 is deposited using an insulating material on the substrate that will serve as the base portion 140 (S300). In the present embodiment, the substrate is a silicon substrate and the first insulating layer 152 is silicon oxide. The first insulating layer 152 is formed by CVD with TEOS (Tetra Ethyl Ortho Silicate) as the material. For example, the silicon oxide first insulating layer 152 may be formed as a result of the TEOS material reacting with oxygen or ozone.

Figure 4:
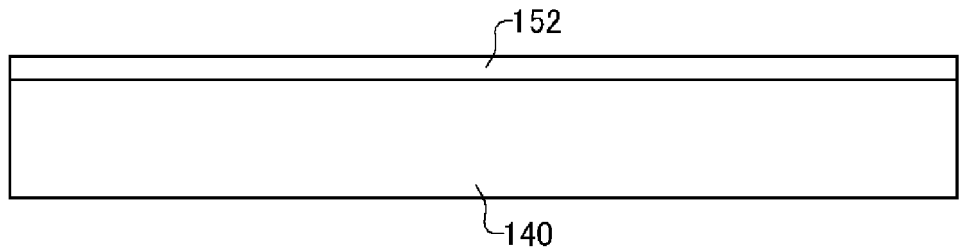
FIG. 4 shows a cross section of a stage at which the first insulating layer 152 is formed on the substrate that will serve as the base portion 140 according to the present embodiment.

Next, the first insulating layer 152 undergoes a first annealing (S304). The first insulating layer 152 is formed on the substrate as a result of the first annealing. FIG. 4 shows a cross section of a stage at which the first insulating layer 152 is formed on the substrate that will serve as the base portion 140 according to the present embodiment.

Next, the first electrode layer 162, the first piezoelectric film 136, and the second electrode layer 164 are formed on the first insulating layer 152 (S310). The first electrode layer 162 is deposited on the first insulating layer 152 using a conductive material. The first piezoelectric film 136 is deposited on the first electrode layer 162 via a sol-gel technique that involves applying sol-gel material on the first electrode layer 162 and then performing annealing. The sol-gel material may include PZT sol-gel liquid. In the present embodiment, the first piezoelectric film 136 is a PZT film formed by applying a PZT sol-gel. The second electrode layer 164 is deposited on the first piezoelectric film 136 using a conductive material.

Figure 5:
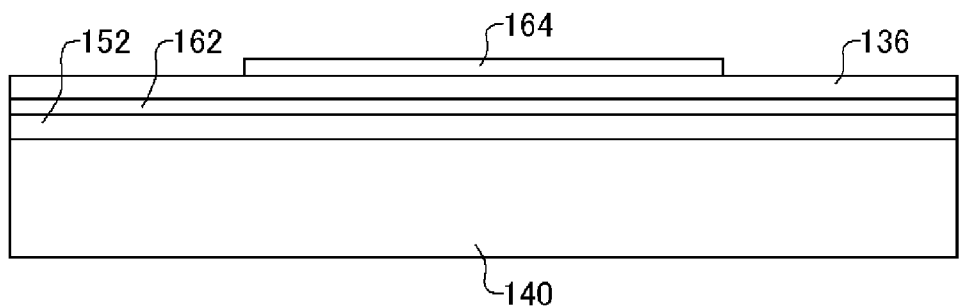
FIG. 5 shows a cross section of a stage at which the first electrode layer 162, the first piezoelectric film 136, and the second electrode layer 164 have been formed on the first insulating layer 152 according to the present embodiment.

The conductive material forming the first electrode layer 162 and the second electrode layer 164 may include platinum (Pt). The first electrode layer 162 and the second electrode layer 164 may be formed by vapor deposition or sputtering. FIG. 5 shows a cross section of a stage at which the first electrode layer 162, the first piezoelectric film 136, and the second electrode layer 164 have been formed on the first insulating layer 152 according to the present embodiment. The second electrode layer 164 may be formed to have a predetermined shape on the first piezoelectric film 136, using photolithography.

Here, the first electrode layer 162 may be formed with a predetermined growth temperature, such that the electrode material of the first electrode layer 162 has a preferred orientation in the <111> direction. As a result, the first piezoelectric film 136 deposited on the first electrode layer 162 has a preferred orientation in the <111> direction according to the orientation of the first electrode layer 162.

The piezoelectric films formed using PZT, for example, according to the present embodiment have maximum piezoelectricity when the crystal axes of all of the crystals are oriented in the <001> direction. However, with these piezoelectric films, even if the growth temperature is adjusted such that the crystal axes are oriented in the <001> direction, the crystal axes of a portion of the crystals are oriented in the <010> or <100> direction. The piezoelectricity of this portion of crystals counteracts the piezoelectricity of the crystals having crystal axes oriented in the <001> direction, and therefore it is difficult to increase the overall piezoelectricity of the piezoelectric films.

In contrast, since the piezoelectric films of the present embodiment are formed such that the crystal axes are oriented in the <111> direction, the orientations in directions such as <001>, <010>, and <100> that counteract the piezoelectricity are prevented. Therefore, the first piezoelectric film 136 can achieve higher piezoelectricity than a piezoelectric film formed by adjusting the growth temperature to create a <001> orientation. Here, in order to orient the crystal axes in the <111> direction, PbTi sol-gel may be applied in advance prior to applying the PZT sol-gel.

Next, the first electrode layer 162, the first piezoelectric film 136, and the second electrode layer 164 are machined (S320). For example, the first electrode layer 162, the first piezoelectric film 136, and the second electrode layer 164 may be machined by being etched such that the surface area thereof is less that the surface area of the second insulating layer 150 to be formed later. The first insulating layer 152 may be used as an etch stop layer. If the second electrode layer 164 is formed having a predetermined shape, the first electrode layer 162 and the first piezoelectric film 136 may be machined to have substantially the same shape as the second electrode layer 164.

Figure 6:
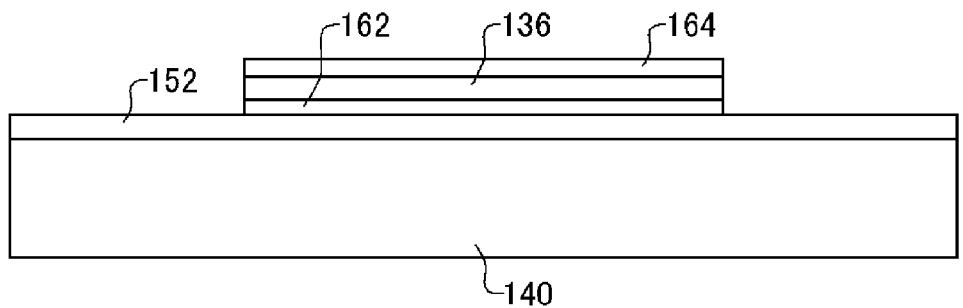
FIG. 6 shows a cross section of a stage at which the first electrode layer 162, the first piezoelectric film 136, and the second electrode layer 164 have been machined according to the present embodiment.

FIG. 6 shows a cross section of a stage at which the first electrode layer 162, the first piezoelectric film 136, and the second electrode layer 164 have been machined according to the present embodiment. The first piezoelectric film 136 and the second electrode layer 164 may be formed to expose, toward the top surface of the substrate, a connecting portion of the first electrode layer 162 to which the wiring sections 114 will later be connected.

Next, the second insulating layer 150 is deposited on the second electrode layer 164 using an insulating material (S330). In the present embodiment, the second insulating layer 150 is made of silicon oxide and covers the first electrode layer 162, the first piezoelectric film 136, and the second electrode layer 164. The second insulating layer 150 may be deposited using CVD, in the same manner as the first insulating layer 152.

Next, the second insulating layer 150 undergoes a second annealing (S334). As a result of the second annealing, the second insulating layer 150 is formed on the second electrode layer 164. The second insulating layer 150 and the first insulating layer 152 are made of the same material, and therefore the first electrode layer 162, the first piezoelectric film 136, and the second electrode layer 164 are formed within the silicon oxide layer formed by the second insulating layer 150 and the first insulating layer 152.

The first annealing and the second annealing are performed for a longer time and at a lower temperature gradient than the annealing for forming the first piezoelectric film 136. For example, the first annealing and the second annealing may be performed for 1 minute or more with a temperature gradient that is less than 10° C. per second. The first annealing and the second annealing are preferably performed for 10 minutes or more with a temperature gradient that is less than 1° C. per second.

The first annealing and the second annealing are more preferably performed for 30 minutes or more with a temperature gradient that is less than 0.33° C. per second. In this way, the first insulating layer 152 and the second insulating layer 150 have impurities such as carbon (C), oxygen (O), and/or hydrogen (H) that were mixed in during the manufacturing process expelled therefrom, for example, thereby forming an insulating film with high purity.

Next, the third electrode layer 166, the second piezoelectric film 138, and the fourth electrode layer 168 are formed on the second insulating layer 150 (S340). The third electrode layer 166 is deposited on the second insulating layer 150 using a conductive material. The second piezoelectric film 138 is deposited by applying sol-gel material on the third electrode layer 166 and then annealing. The fourth electrode layer 168 is deposited on the second piezoelectric film using a conductive material.

Figure 7:
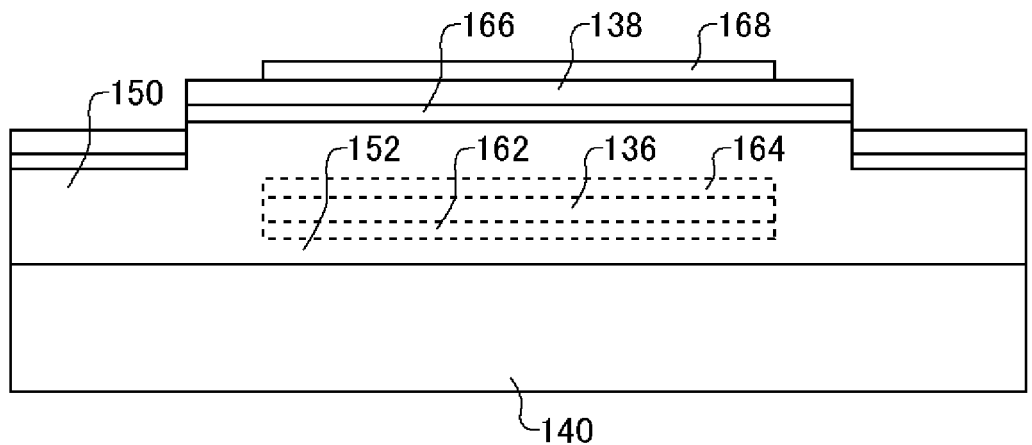
FIG. 7 shows a cross section of a stage at which the second insulating layer 150, the third electrode layer 166, the second piezoelectric film 138, and the fourth electrode layer 168 are formed on the second electrode layer 164 according to the present embodiment.

The third electrode layer 166, the second piezoelectric film 138, and the fourth electrode layer 168 may be formed in the same manner as the first electrode layer 162, the first piezoelectric film 136, and the second electrode layer 164 formed on the first insulating layer 152 in step S310. FIG. 7 shows a cross section of a stage at which the second insulating layer 150, the third electrode layer 166, the second piezoelectric film 138, and the fourth electrode layer 168 are formed on the second electrode layer 164 according to the present embodiment. Here, the fourth electrode layer 168 may be formed with a predetermined shape on the second piezoelectric film 138 using photolithography.

The third electrode layer 166 may be formed with a predetermined growth temperature, such that the electrode material of the third electrode layer 166 has a preferred orientation in the <111> direction. As a result, the second piezoelectric film 138 has a preferred orientation in the <111> direction according to the orientation of the third electrode layer, in the same manner as the first piezoelectric film 136. Therefore, the second piezoelectric film 138 has higher piezoelectricity than a piezoelectric film that is actually oriented in the <001> direction.

Figure 8:
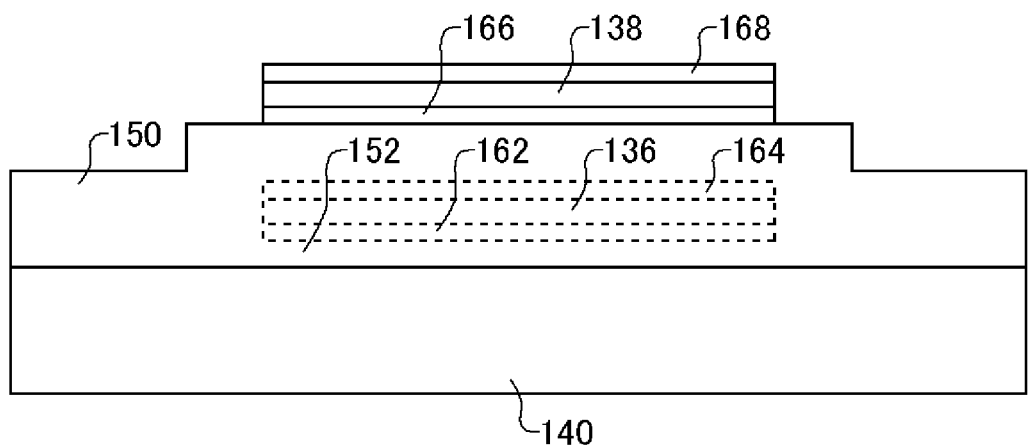
FIG. 8 shows a cross section of a stage at which the third electrode layer 166, the second piezoelectric film 138, and the fourth electrode layer 168 have been machined according to the present embodiment.

Next, the third electrode layer 166, the second piezoelectric film 138, and the fourth electrode layer 168 are machined (S350). The third electrode layer 166, the second piezoelectric film 138, and the fourth electrode layer 168 may be machined to have less surface area than the second insulating layer 150, in the same manner as the first electrode layer 162, the first piezoelectric film 136, and the second electrode layer 164 machined in step S320. FIG. 8 shows a cross section of a stage at which the third electrode layer 166, the second piezoelectric film 138, and the fourth electrode layer 168 have been machined according to the present embodiment.

The third electrode layer 166 may be formed to expose, toward the top surface of the substrate, connecting portions of the first electrode layer 162 and the second electrode layer 164 to which the wiring sections 114 will later be connected. The second piezoelectric film 138 and the fourth electrode layer 168 may be formed to expose, toward the top surface of the substrate, a connecting portion of the first electrode layer 162, the second electrode layer 164, and the third electrode layer 166 to which the wiring sections 114 will later be connected.

Figure 9:
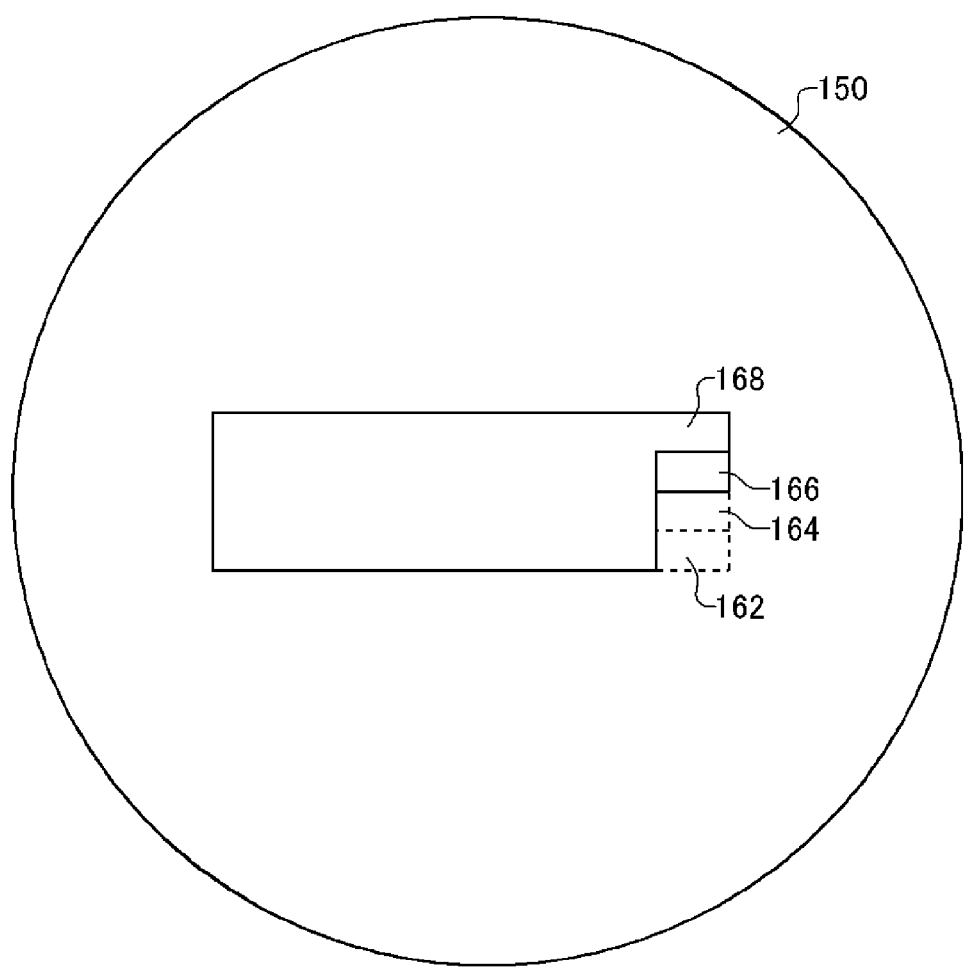
FIG. 9 is a top view of a stage at which the third electrode layer 166, the second piezoelectric film 138, and the fourth electrode layer 168 have been machined according to the present embodiment.

FIG. 9 is a top view of a stage at which the third electrode layer 166, the second piezoelectric film 138, and the fourth electrode layer 168 have been machined according to the present embodiment. FIG. 9 shows one actuator 130, made of a plurality of electrode layers and piezoelectric films, formed on the substrate. The diameter of the substrate used in this manufacturing may be 2 inches or more, in which case a plurality of actuators 130 are formed on the substrate.

In the present embodiment, the third electrode layer 166, the second piezoelectric film 138, and the fourth electrode layer 168 are machined to have less surface area than the second insulating layer 150 that will be machined later, and therefore the second insulating layer 150 is exposed on a portion of the substrate. Furthermore, the connecting sections of the electrode layers, which respectively connect the first electrode layer 162, the second electrode layer 164, and the third electrode layer 166 to the corresponding wiring sections 114, are formed to be exposed from above.

Next, the third insulating layer 154 is deposited on the fourth electrode layer 168 using an insulating material (S360). In the present embodiment, the third insulating layer 154 is made of silicon oxide, and is formed to cover the fourth electrode layer 168, the second piezoelectric film 138, and the third electrode layer 166 together with the second insulating layer 150. The third insulating layer 154 may be deposited using CVD, in the same manner as the second insulating layer 150 and the first insulating layer 152.

Figure 10:
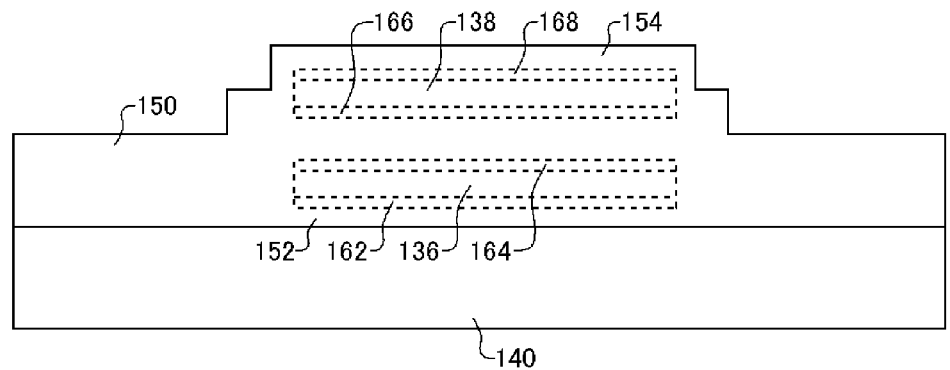
FIG. 10 shows a cross section of a stage at which the third insulating layer 154 has been formed on the fourth electrode layer 168 according to the present embodiment.

Next, the third insulating layer 154 undergoes a third annealing (S364). As a result of the third annealing, the third insulating layer 154 is formed on the fourth electrode layer 168. The third insulating layer 154 and the second insulating layer 150 are made of the same material, and therefore the fourth electrode layer 168, the second piezoelectric film 138, and the third electrode layer 166 are formed within the silicon oxide layer formed by the second insulating layer 150 and the third insulating layer 154. FIG. 10 shows a cross section of a stage at which the third insulating layer 154 has been formed on the fourth electrode layer 168 according to the present embodiment.

The third annealing may be performed for a longer time and at a lower temperature gradient than the annealing for forming the first piezoelectric film 136 or the second piezoelectric film 138. In this way, impurities that were mixed in during the manufacturing process, for example, can be expelled from the third insulating layer 154, in the same manner as the first insulating layer 152 and the second insulating layer 150, thereby forming an insulating film with high purity.

Next, the second insulating layer 150, the first insulating layer 152, and the third insulating layer 154 are machined (S370). Here, the second insulating layer 150, the third insulating layer 154, and the first insulating layer 152 are machined while covering the first piezoelectric film 136, the second piezoelectric film 138, the first electrode layer 162, the second electrode layer 164, the third electrode layer 166, and the fourth electrode layer 168, to achieve the shape of the actuator 130.

Furthermore, the second insulating layer 150, the first insulating layer 152, and the third insulating layer 154 are formed such that the protruding section 156, on which the second piezoelectric film 138 and the first piezoelectric film 136 are not provided, remains at a tip portion at the moving end of the actuator 130. The second insulating layer 150, the first insulating layer 152, and the third insulating layer 154 may be formed using etching.

Figure 11:
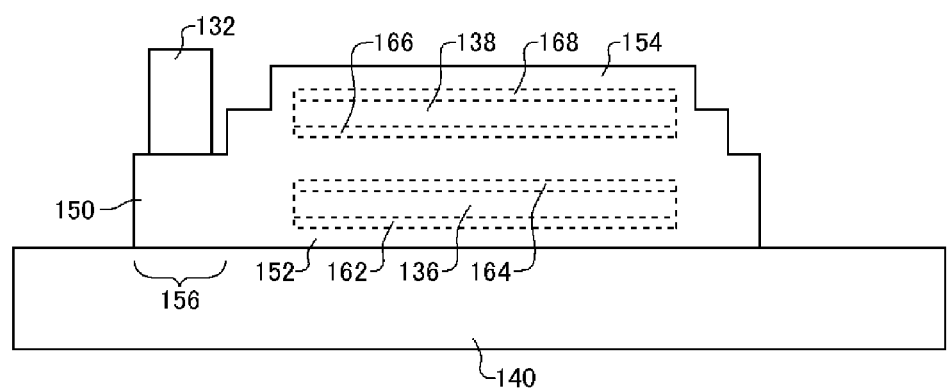
FIG. 11 shows a cross section of a stage at which the second insulating layer 150, the first insulating layer 152, and the third insulating layer 154 have been machined and the second contact point section 132 has been formed according to the present embodiment.

Next, the second contact point section 132 is formed on the protruding section 156 (S380). FIG. 11 shows a cross section of a stage at which the second insulating layer 150, the first insulating layer 152, and the third insulating layer 154 have been machined and the second contact point section 132 has been formed according to the present embodiment. Here, the second insulating layer 150 and the third insulating layer 154 are formed to expose the connecting section of each electrode.

Figure 12:
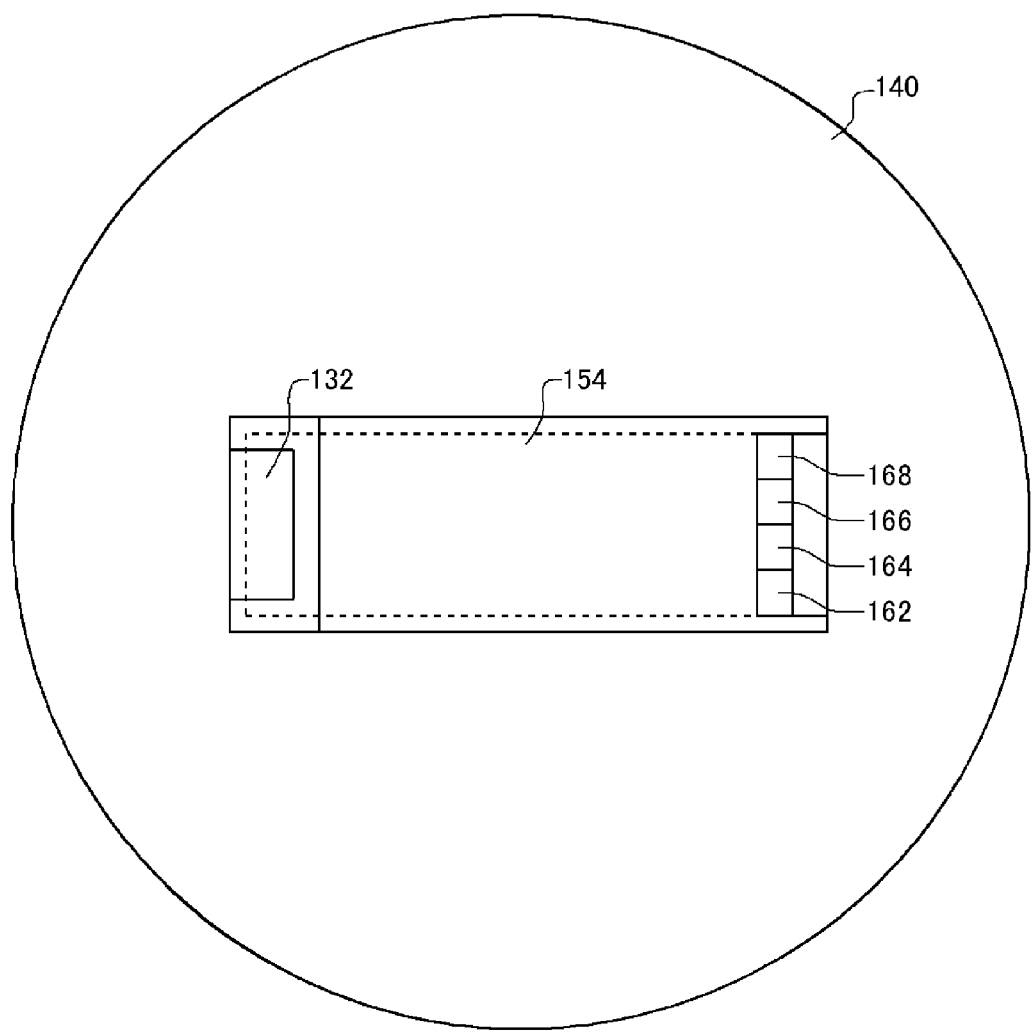
FIG. 12 is a top view of a stage at which the second insulating layer 150, the first insulating layer 152, and the third insulating layer 154 have been machined and the second contact point section 132 has been formed according to the present embodiment.

FIG. 12 is a top view of a stage at which the second insulating layer 150, the first insulating layer 152, and the third insulating layer 154 have been machined and the second contact point section 132 has been formed according to the present embodiment. At this stage, the second insulating layer 150, the first insulating layer 152, and the third insulating layer 154 have been machined to have the surface shape of the actuator 130, and therefore the portion of the substrate that will serve as the base portion 140 is exposed. Furthermore, the connecting sections of the first electrode layer 162, the second electrode layer 164, the third electrode layer 166, and the fourth electrode layer 168 are exposed from above.

Figure 13:
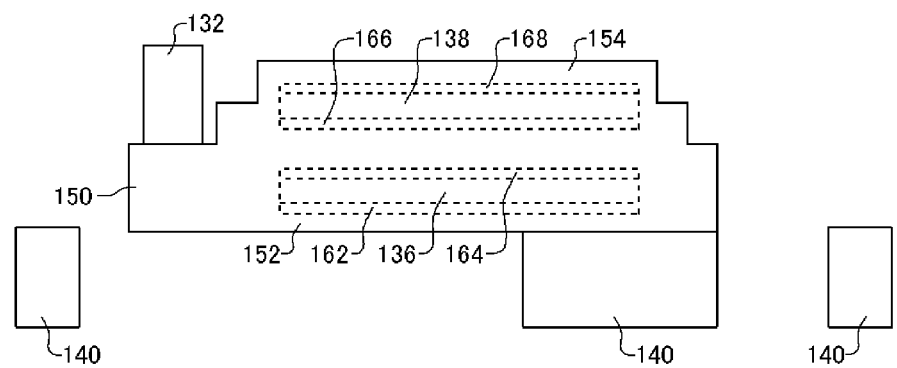
FIG. 13 shows a cross section of a stage at which the substrate has been machined to form the base portion 140 according to the present embodiment.

Next, the substrate is machined to form the base portion 140 (S390). The base portion 140 is formed by etching and removing a portion of the semiconductor substrate from a surface of the semiconductor substrate that is opposite the surface on which the actuator 130 is formed, while using the first insulating layer 152 as the etching stop layer. At this stage, the actuator 130 is separated from the substrate, and becomes independent from the substrate, with the base portion 140 as a fixed end. FIG. 13 shows a cross section of a stage at which the substrate has been machined to form the base portion 140 according to the present embodiment.

Figure 14:
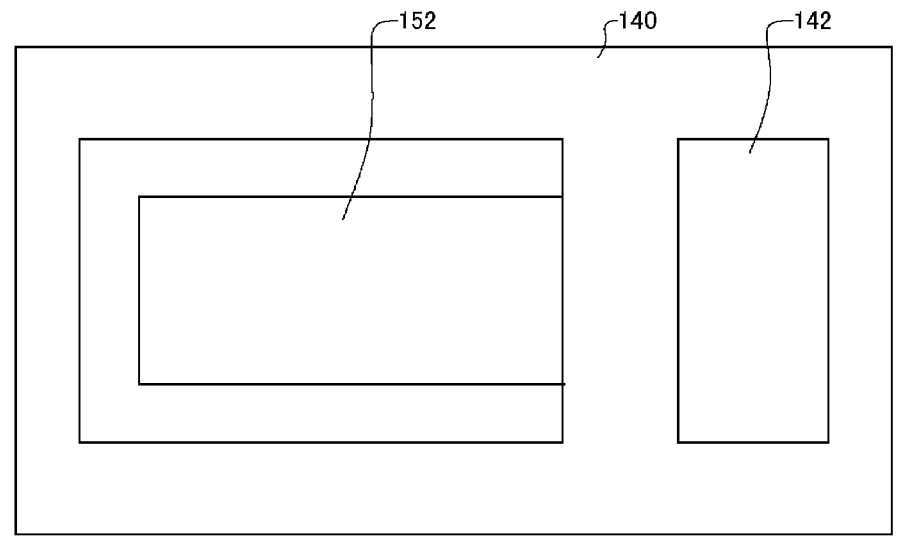
FIG. 14 is a bottom view of a stage at which the substrate has been machined to form the base portion 140 according to the present embodiment.

FIG. 14 is a bottom view of a stage at which the substrate has been machined to form the base portion 140 according to the present embodiment. In other words, FIG. 14 shows the actuator 130 as seen from the base portion 140 side. The first insulating layer 152 is exposed on the base portion 140 side of the actuator 130. The base portion 140 may include an aperture 142. The aperture 142 may be used to connect electrical wiring for exchanging electrical signals with the actuator 130.

Next, the base portion 140 is connected to the lower substrate section 110 and the upper substrate section 170. The lower substrate section 110 and the upper substrate section 170 of the present embodiment are each formed of a glass substrate, and may be bonded to the base portion 140 using anodic bonding, in which bonding is achieved by applying heat while also applying voltage.

Figure 15:
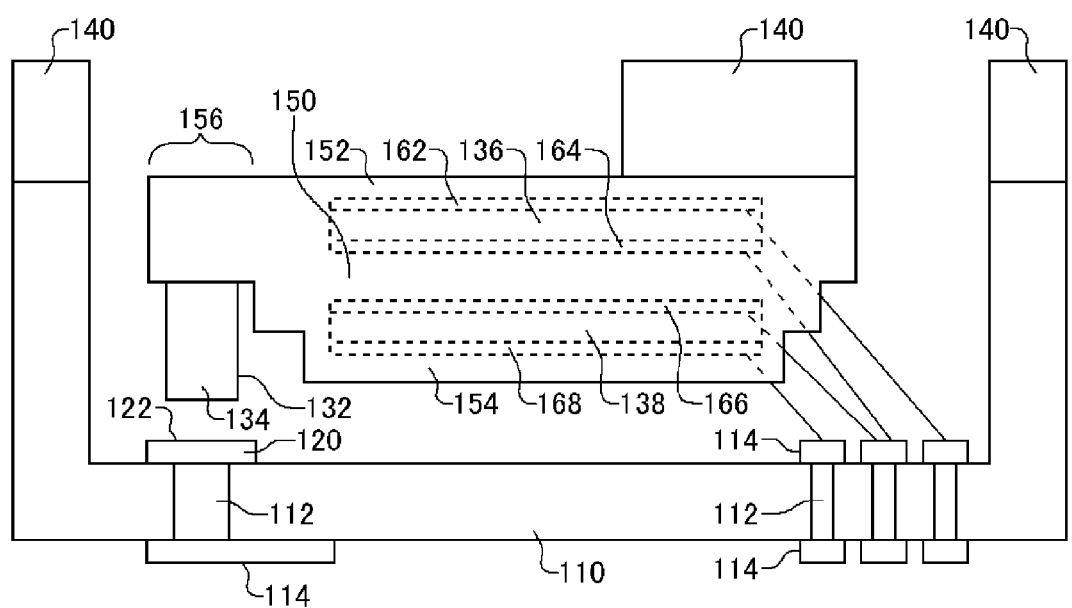
FIG. 15 shows a cross section of a stage at which the base portion 140 is connected to the lower substrate section 110 according to the present embodiment.

FIG. 15 shows a cross section of a stage at which the base portion 140 is connected to the lower substrate section 110 according to the present embodiment. The connecting sections of the first electrode layer 162, the second electrode layer 164, the third electrode layer 166, and the fourth electrode layer 168 may be connected to wiring sections 114 provided in the lower substrate section 110. The wiring sections 114 and the connecting sections may be connected to each other using pressure bonding. The connection operation may be performed through the aperture 142 of the base portion 140.

Figure 16:
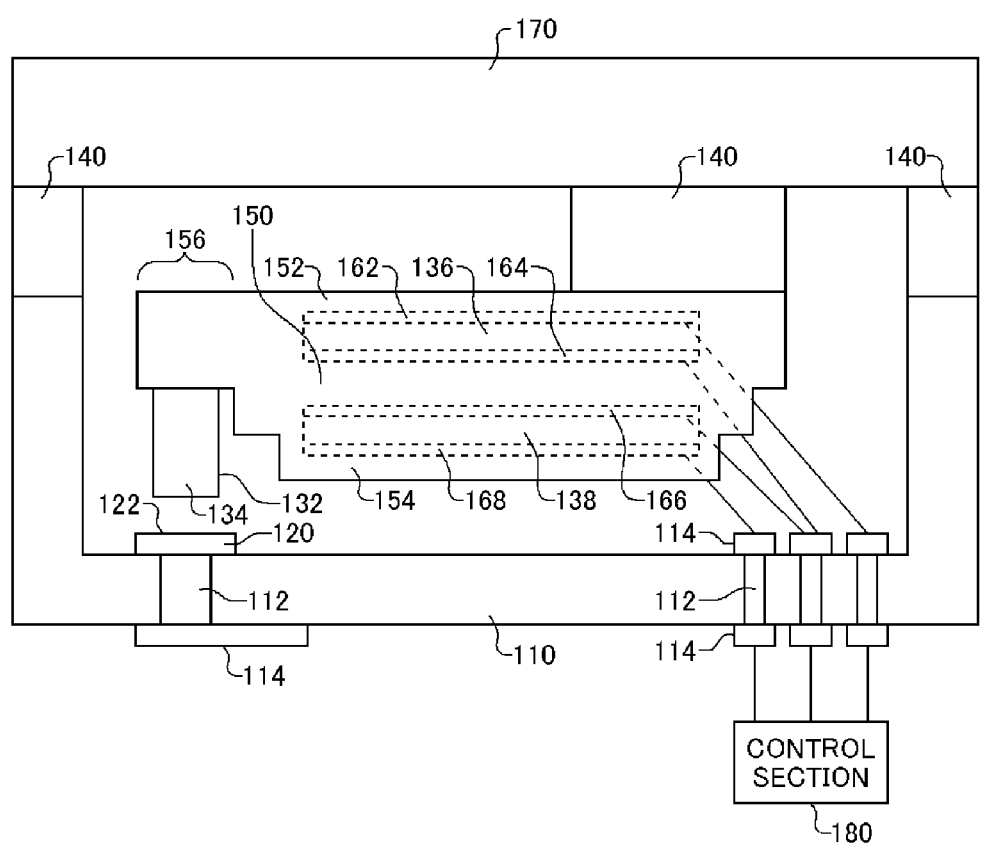
FIG. 16 shows a cross section of a stage at which the base portion 140 is connected to the upper substrate section 170 according to the present embodiment.

FIG. 16 shows a cross section of a stage at which the base portion 140 is connected to the upper substrate section 170 according to the present embodiment. In the switching apparatus 100 formed in this way, the actuator 130 is driven according to a control signal from the control section 180 provided outside the substrate, to bring the first contact point 122 and the second contact point 134 into contact with each other or move the first contact point 122 and the second contact point 134 away from each other.

In the manner described above, the switching apparatus 100 of the present embodiment includes an actuator formed by covering the first piezoelectric film 136, the second piezoelectric film 138, the first electrode layer 162, the second electrode layer 164, the third electrode layer 166, and the fourth electrode layer 168 with the second insulating layer 150 and the first insulating layer 152 and third insulating layer 154 having substantially the same elasticity and rigidity as the second insulating layer 150. The switching apparatus 100 of the present embodiment described above includes the actuator 130 having the first piezoelectric film 136 and the second piezoelectric film 138, but instead, the actuator 130 may have three or more piezoelectric films layered therein. In this case, the actuator 130 may include a plurality of layers of piezoelectric films and electrodes layered on the first piezoelectric film 136 and/or the second piezoelectric film 138.

Instead, the switching apparatus 100 may include an actuator 130 having either the second piezoelectric film 138 or the first piezoelectric film 136. If the actuator 130 includes the second piezoelectric film 138, the second insulating layer 150 may be formed on the substrate that will serve as the base portion 140 in place of the first insulating layer 152. The second insulating layer 150 uses the same insulating material as the first insulating layer 152, and can therefore be used as the etching stop layer when etching the base portion.

In the manner described above, in the switching apparatus 100 of the present embodiment, the first piezoelectric film 136 on the first electrode layer 162 and the second piezoelectric film 138 on the third electrode layer 166 can be formed using the sol-gel technique. As a result, at least one of the first piezoelectric film 136 and the second piezoelectric film 138 can have a lattice constant that matches with the lattice constant of whichever of the first electrode layer 162 and the third electrode layer 166 is adjacent thereto, thereby contacting the film with substantially the same average grain size in the surface direction.

At least one of the first piezoelectric film 136 and the second piezoelectric film 138 can form a rhombohedral crystal ferroelectric thin film having a Perovskite structure and intrinsic polarization. Accordingly, the switching apparatus 100 of the present embodiment may include an actuator that can move in a range of tens of μm, for example.

Figure 17:
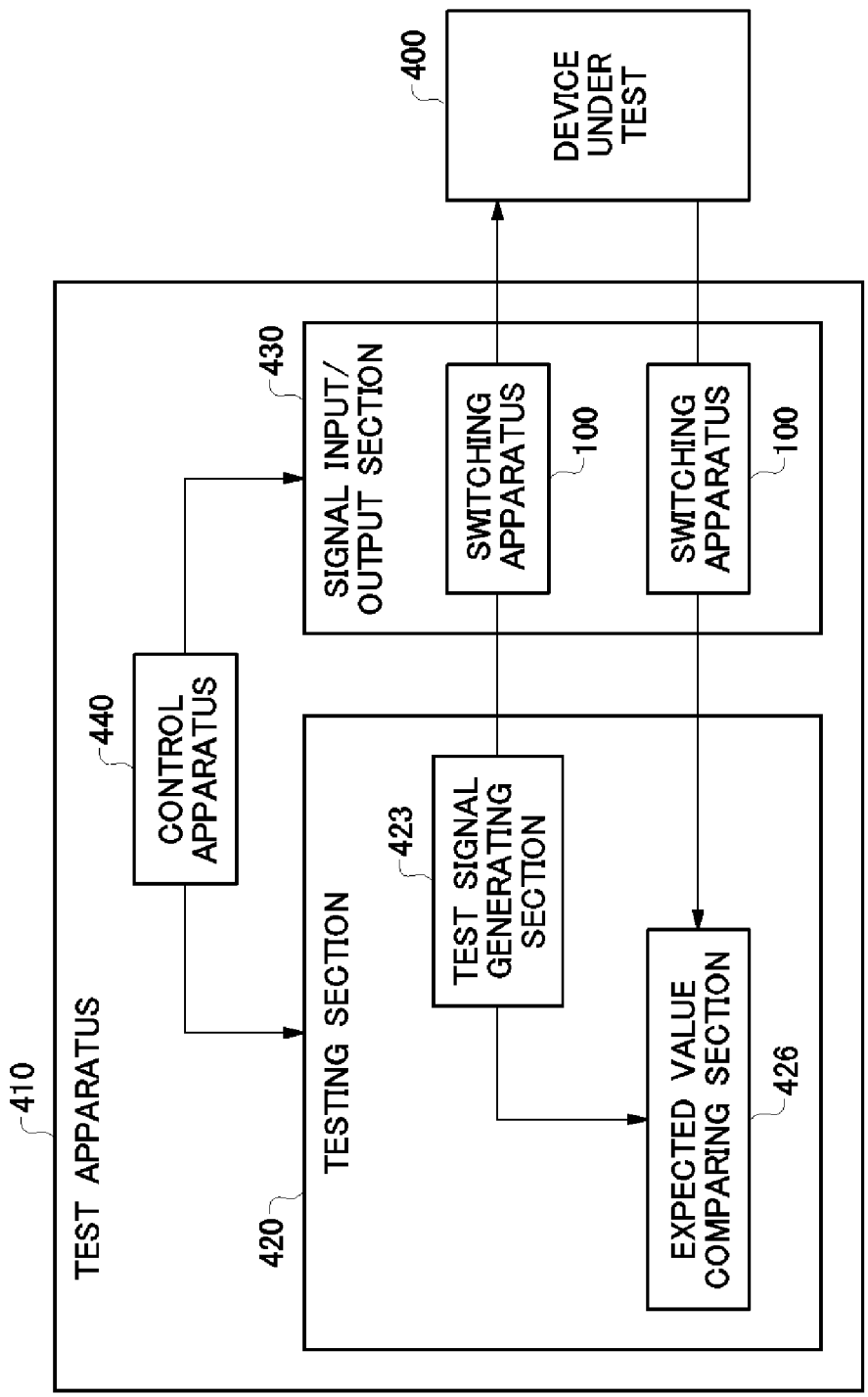
FIG. 17 shows an exemplary configuration of a test apparatus 410 according to the present embodiment, along with a device under test 400.

FIG. 17 shows an exemplary configuration of a test apparatus 410 according to the present embodiment, along with a device under test 400. The test apparatus 410 tests at least one device under test 400, which may be an analog circuit, a digital circuit, an analog/digital mixed circuit, a memory, or a system on chip (SOC), for example. The test apparatus 410 supplies the device under test 400 with a test signal based on a test pattern for testing the device under test 400, and judges pass/fail of the device under test 400 based on an output signal output by the device under test 400 in response to the test signal.

The test apparatus 410 includes a testing section 420, a signal input/output section 430, and a control apparatus 440. The testing section 420 tests the device under test 400 by exchanging electric signals with the device under test 400. The testing section 420 includes a test signal generating section 423 and an expected value comparing section 426.

The test signal generating section 423 is connected to one or more devices under test 400, via the signal input/output section 430, and generates a plurality of test signals to be supplied to the device under test 400. The test signal generating section 423 may generate expected values for the response signals output by the device under test 400 in response to the test signals.

The expected value comparing section 426 compares the data value included in the response signal of the device under test 400 received from the signal input/output section 430 to an expected value generated by the test signal generating section 423. The value comparing section 426 judges pass/fail of the device under test 400 based on the comparison result.

The signal input/output section 430 provides an electrical connection between the testing section 420 and the device under test 400 to be tested, and transmits test signals generated by the test signal generating section 423 to this device under test 400. The signal input/output section 430 receives response signals output by the device under test 400 in response to the test signals. The signal input/output section 430 transmits the received response signals of the device under test 400 to the value comparing section 426. The signal input/output section 430 may be a performance board mounted on a plurality of devices under test 400. The signal input/output section 430 includes the switching apparatus 100.

The switching apparatus 100 is provided between the testing section 420 and the device under test 400, and provides an electrical connection or disconnection between the testing section 420 and the device under test 400. The test apparatus 410 performs electrical connecting or disconnecting using the switching apparatus 100 according to the present embodiment.

The present embodiment describes an example in which the signal input/output section 430 is connected to one device under test 400, and one switching apparatus 100 is provided to each of the input signal line and the output signal line of the one device under test 400. Instead, the signal input/output section 430 may be connected to a plurality of devices under test 400, and one switching apparatus 100 may be provided to each input signal line and output signal line of each device under test 400. If there is one input/output signal line connecting the signal input/output section 430 to the device under test 400, one switching apparatus 100 may be provided to the one input/output line.

The control apparatus 440 transmits a control signal to the testing section 420 and the signal input/output section 430, to begin execution of the testing by the test apparatus 410. The control apparatus 440 transmits a control signal that causes the testing section 420 to perform a comparison between the test result and the expected value or to generate a test signal, for example, according to a test program. Furthermore, according to the test program, the control apparatus 440 transmits to the signal input/output section 430 instructions for connecting the switching apparatuses 100 provided to signal input/output lines to be connected and instructions for disconnecting the switching apparatuses 100 provided to signal input/output lines to be disconnected.

The test apparatus 410 according to the present embodiment described above can perform testing using a switching apparatus 100 that includes an actuator 130 that can prevent physical damage such as cracking, chipping, and fracturing while increasing rigidity. Furthermore, the test apparatus 410 can perform testing using a switching apparatus 100 with a longer lifetime and switching control with low power consumption by controlling the voltage. Yet further, the test apparatus 410 can perform testing using a switching apparatus 100 that decreases the occurrence of contact points sticking together.

Figure 18:
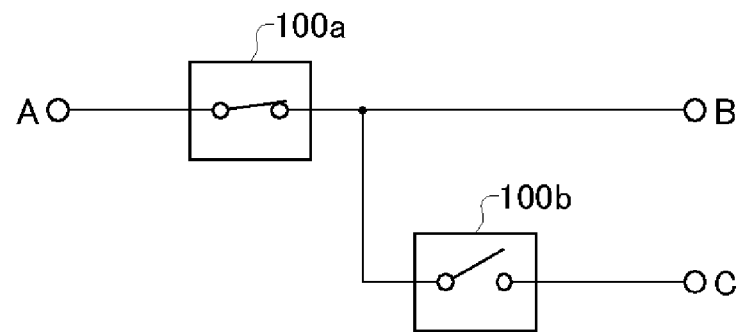
FIG. 18 shows an exemplary configuration of a transmission line switching apparatus 500 according to the present embodiment.

FIG. 18 shows an exemplary configuration of a transmission line switching apparatus 500 according to the present embodiment. The transmission line switching apparatus 500 includes a plurality of switching apparatuses 100 that are each connected between an input end and a corresponding one of a plurality of output ends. The transmission line switching apparatus 500 of the present embodiment includes a switching apparatus 100a and a switching apparatus 100b that are respectively between an input end A and output ends B and C.

The transmission line switching apparatus 500 electrically connects the input end A to the output end B and disconnects the input end A from the output end C, by turning ON the switching apparatus 100a and turning OFF the switching apparatus 100b. Furthermore, the transmission line switching apparatus 500 electrically disconnects the input end A from both the output end B and the output end C and electrically connects the output end B to the output end C, by turning OFF the switching apparatus 100a and turning ON the switching apparatus 100b.

In this way, the transmission line switching apparatus 500 can switch the transmission path between the input end and the plurality of output ends by turning the plurality of switching apparatuses ON and OFF. The transmission line switching apparatus 500 may be an apparatus in which a plurality of switching apparatuses are housed and sealed within one package, for example.

Figure 19:
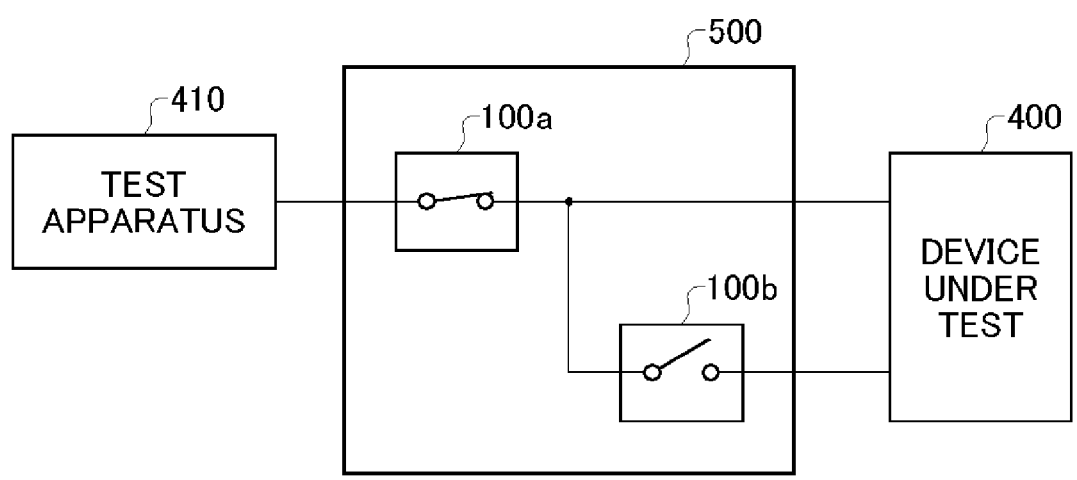
FIG. 19 shows an exemplary configuration of a test apparatus performing a loop-back test according to the present embodiment, along with the device under test 400.

FIG. 19 shows an exemplary configuration of a test apparatus performing a loop-back test according to the present embodiment, along with the device under test 400. The test apparatus performing the loop-back test of the present embodiment is formed by combining the test apparatus 410 described in FIG. 17 and the transmission line switching apparatus 500 described in FIG. 18. Therefore, components that are substantially the same as those of the test apparatus 410 or the transmission line switching apparatus 500 of the present embodiment described in FIGS. 17 and 18 are given the same reference numerals, and descriptions thereof are omitted.

When the supplying a test signal from the test apparatus 410 to the device under test 400, the test apparatus of the present embodiment turns ON the switching apparatus 100a of the transmission line switching apparatus 500 and turns OFF the switching apparatus 100b. Furthermore, when looping the signal output from the device under test 400 back to the device under test 400, the test apparatus of the present embodiment turns OFF the switching apparatus 100a of the transmission line switching apparatus 500 and turns ON the switching apparatus 100b.

In this way, the test apparatus of the present embodiment can switch between a transmission path by which a test signal for testing the device under test 400 is transmitted from the test apparatus 410 to the device under test 400 and a transmission path by which a signal from the device under test 400 is looped back and input to the device under test 400. The test apparatus performing the loop-back test of the present embodiment includes one transmission line switching apparatus 500 in the example described above, but instead, the test apparatus of the present embodiment may include two or more transmission line switching apparatuses 500. In this case, the test apparatus of the present embodiment may switch between testing of the device under test 400 using a test signal and the loop-back test, by switching among a plurality of transmission paths between the test apparatus 410 and the device under test 400.

The test apparatus for performing the loop-back test of the present embodiment described above can switch between testing with a test signal and a loop-back test, using switching apparatuses 100 that each include an actuator 130 that can prevent physical damage such as cracking, chipping, and fracturing while increasing rigidity. Furthermore, the test apparatus of the present embodiment switch between two types of testing using switching apparatuses 100 with a longer lifetime and switching control with low power consumption by controlling the voltage. Yet further, the test apparatus of the present embodiment can switch between two types of testing using switching apparatuses 100 that decrease the occurrence of contact points sticking together.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A manufacturing method comprising:
first insulating layer deposition of depositing a first insulating layer on a substrate using an insulating material;
first annealing of annealing the first insulating layer;
first electrode layer deposition of depositing a first electrode layer on the first insulating layer using a conductive material;
first piezoelectric film deposition of depositing a first piezoelectric film on the first electrode layer by applying a sol-gel material on the first electrode layer and annealing the sol-gel material;
second electrode layer deposition of depositing a second electrode layer on the first piezoelectric film using a conductive material;
second insulating layer deposition of depositing a second insulating layer on the second electrode layer using an insulating material; and
second annealing of annealing the second insulating layer, wherein
the first electrode layer is provided between the first insulating layer and the first piezoelectric film, and the second electrode layer is provided between the first piezoelectric film and the second insulating layer, and
the first annealing and the second annealing are each performed with an annealing time greater than or equal to an annealing time of the annealing performed during the first piezoelectric film deposition and with a temperature gradient less than or equal to a temperature gradient of the annealing performed during the first piezoelectric film deposition.

2. The manufacturing method according to claim 1, further comprising first machining of machining the first electrode layer, the second electrode layer, and the first piezoelectric film to have less surface area than the second insulating layer.

3. The manufacturing method according to claim 1, further comprising:
third electrode layer deposition of depositing a third electrode layer on the second insulating layer using a conductive material;

second piezoelectric film deposition of depositing a second piezoelectric film on the third electrode layer, by applying a sol-gel material on the third electrode layer and annealing the sol-gel material;

fourth electrode layer deposition of depositing a fourth electrode layer on the second piezoelectric film using a conductive material;

third insulating layer deposition of depositing a third insulating layer on the fourth electrode layer using an insulating material; and third annealing of annealing the third insulating layer.

4. The manufacturing method according to claim 3, wherein
the third annealing is performed with an annealing time greater than or equal to the annealing time of the annealing performed during the first piezoelectric film deposition and the second piezoelectric film deposition and with a temperature gradient less than or equal to the temperature gradient of the annealing performed during the first piezoelectric film deposition.

5. The manufacturing method according to claim 3, further comprising second machining of machining the third electrode layer, the fourth electrode layer, and the second piezoelectric film to have less surface area than the second insulating layer.

6. The manufacturing method according to claim 3, wherein
at least one of the first piezoelectric film and the second piezoelectric film has a lattice constant that matches a lattice constant of whichever of the first electrode layer and the third electrode layer is adjacent thereto, and has substantially the same average grain size when contacting the adjacent layer in a surface direction.

7. The manufacturing method according to claim 3, wherein
at least one of the first piezoelectric film and the second piezoelectric film is a ferroelectric thin film that has a Perovskite structure and is formed of a tetragonal crystal, a rhombohedral crystal, or a combination of a tetragonal crystal and a rhombohedral crystal having intrinsic polarization.

8. The manufacturing method according to claim 1, wherein
the insulating material is formed using CVD with TEOS as a material.

9. The manufacturing method according to claim 1, wherein
the insulating material includes $SiO_2$ or SiN.

10. The manufacturing method according to claim 1, wherein
the conductive material includes Pt.

11. The manufacturing method according to claim 1, wherein
the sol-gel material includes PZT sol-gel liquid.

12. A switching apparatus comprising:
a contact point section including a first contact point; and
an actuator that is manufactured according to the manufacturing method of claim 1, further includes a second contact point, and moves the second contact point to contact or move away from the first contact point.

13. A transmission line switching apparatus comprising a plurality of the switching apparatuses of claim 12 connected respectively between an input end and a plurality of output ends.

14. A test apparatus that performs a loop-back test on a device under test, the test apparatus comprising:
a testing section that tests the device under test by exchanging electrical signals with the device under test; and
the transmission line switching apparatus according to claim 13 that is provided between the testing section and the device under test and switches whether a signal from the testing section is supplied to the device under test or a signal from the device under test is looped back to the device under test.

15. A test apparatus that tests a device under test, the test apparatus comprising:
a testing section that tests the device under test by exchanging electrical signals with the device under test; and
the switching apparatus according to claim 12 that is provided between the testing section and the device under test and electrically connects the testing section to the device under test or electrically disconnects the device under test from the testing section.

* * * * *